United States Patent
Entsfellner et al.

(10) Patent No.: US 9,331,726 B2
(45) Date of Patent: May 3, 2016

(54) METHOD FOR LOCATING DEFECTIVE POINTS IN A HIGH FREQUENCY (HF) SIGNAL TRANSMISSION PATH

(71) Applicant: ROSENBERGER HOCHFREQUENZTECHNIK GMBH & CO. KG, Fridolfing (DE)

(72) Inventors: Christian Entsfellner, Fridolfing (DE); Benjamin Kaindl, Fridolfing (DE)

(73) Assignee: Rosenberger Hochfrequenztechnik GmbH & Co. KG, Fridolfing (DE)

(*) Notice: Subject to any disclaimer, the term of this patent is extended or adjusted under 35 U.S.C. 154(b) by 0 days.

(21) Appl. No.: 14/647,686

(22) PCT Filed: Sep. 25, 2013

(86) PCT No.: PCT/EP2013/002874
§ 371 (c)(1),
(2) Date: May 27, 2015

(87) PCT Pub. No.: WO2014/082690
PCT Pub. Date: Jun. 5, 2014

(65) Prior Publication Data
US 2015/0318879 A1    Nov. 5, 2015

(30) Foreign Application Priority Data
Nov. 30, 2012 (DE) .......................... 10 2012 023 448

(51) Int. Cl.
*H03K 3/00* (2006.01)
*H03D 1/04* (2006.01)
(Continued)

(52) U.S. Cl.
CPC .............. *H04B 1/0475* (2013.01); *G01R 31/11* (2013.01); *H04L 27/04* (2013.01); *H04L 27/20* (2013.01); *H04L 27/34* (2013.01); *H04B 17/17* (2015.01)

(58) Field of Classification Search
USPC ................................. 375/219, 221, 222, 220, 375/240.26–240.29, 285, 296, 297, 298, 375/300, 302, 309, 311, 312, 316, 318, 211, 375/214, 27, 259, 260, 261, 268, 271, 279, 375/284, 295, 303, 315, 322, 320, 324, 338, 375/340, 346, 349, 358
See application file for complete search history.

(56) References Cited

U.S. PATENT DOCUMENTS 7,123,145 B2 * 10/2006 Reilly ..................... G01S 13/56
340/541
2003/0179831 A1 * 9/2003 Gupta ................... H03F 1/3247
375/296
(Continued)

FOREIGN PATENT DOCUMENTS

DE    10 2010 015102 A1    10/2011
WO         0102810 A1    1/2001
(Continued)

*Primary Examiner* — Linda Wong
(74) *Attorney, Agent, or Firm* — DeLio, Peterson & Curcio, LLC; Robert Curcio

(57) ABSTRACT

A method for locating defects in a signal transmission path by generating an HF signal having a frequency $f_1$ and a signal modulated by a predetermined type of modulation; generating a HF signal 2 having a frequency $f_2$; generating an intermodulation product in the form of an intermodulation product signal having frequency $f_{IM\text{-}GENERATED}$ from HF signals 1 and 2; introducing the HF signals 1 and 2 into the signal transmission path at an introduction point; receiving an intermodulation product from the HF signals 1 and 2 at a defective point and reflected back and corresponding to the generated intermodulation product, in the form of an intermodulation product signal; determining a time lag $t_x$ between the generated intermodulation product signal and the received intermodulation product signal by a cross-correlation and calculation of a length L between the introduction point and the place of signal reflection, from the time lag $t_x$.

10 Claims, 2 Drawing Sheets

(51) Int. Cl.
*H04B 1/10* (2006.01)
*H04B 1/04* (2006.01)
*H04L 27/04* (2006.01)
*H04L 27/20* (2006.01)
*H04L 27/34* (2006.01)
*G01R 31/11* (2006.01)
*H04B 17/17* (2015.01)

(56) References Cited

U.S. PATENT DOCUMENTS

| | | | | |
|---|---|---|---|---|
| 2004/0008095 | A1* | 1/2004 | Siavash | H03H 7/06 333/168 |
| 2006/0087374 | A1* | 4/2006 | Khanifar | H03F 1/0261 330/151 |
| 2006/0105715 | A1* | 5/2006 | Kodani | H03F 1/32 455/63.1 |
| 2006/0139971 | A1* | 6/2006 | Suzuki | H02M 1/126 363/39 |
| 2006/0140643 | A1* | 6/2006 | Way | H04B 10/50 398/183 |
| 2009/0134954 | A1* | 5/2009 | Uzunov | H03H 1/0007 333/174 |
| 2009/0196629 | A1* | 8/2009 | Zheng | H04B 10/58 398/193 |
| 2010/0295612 | A1* | 11/2010 | Ohkawara | H03F 1/3258 330/149 |
| 2011/0007527 | A1* | 1/2011 | Liu | H02M 3/33561 363/21.02 |
| 2011/0050372 | A1* | 3/2011 | Hisayasu | H03F 1/22 334/78 |
| 2011/0133664 | A1* | 6/2011 | Imam | H05B 41/2887 315/283 |
| 2012/0094614 | A1* | 4/2012 | Komori | H04B 1/109 455/73 |
| 2012/0169433 | A1* | 7/2012 | Mullins | H03H 7/1758 333/181 |

FOREIGN PATENT DOCUMENTS

| | | |
|---|---|---|
| WO | 03027691 A2 | 4/2003 |
| WO | 2006032854 A1 | 3/2006 |
| WO | 2010001139 A2 | 1/2010 |

* cited by examiner

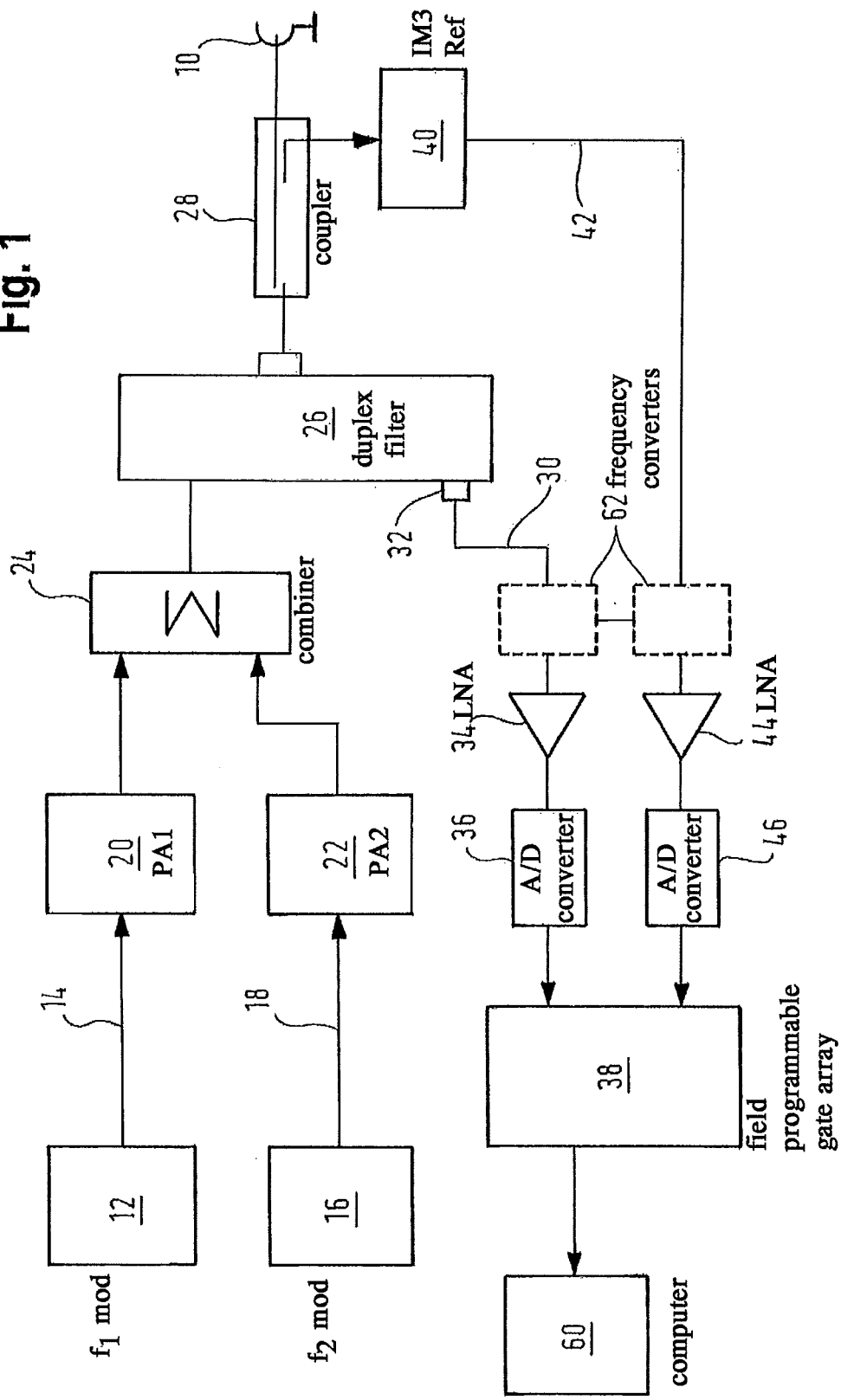

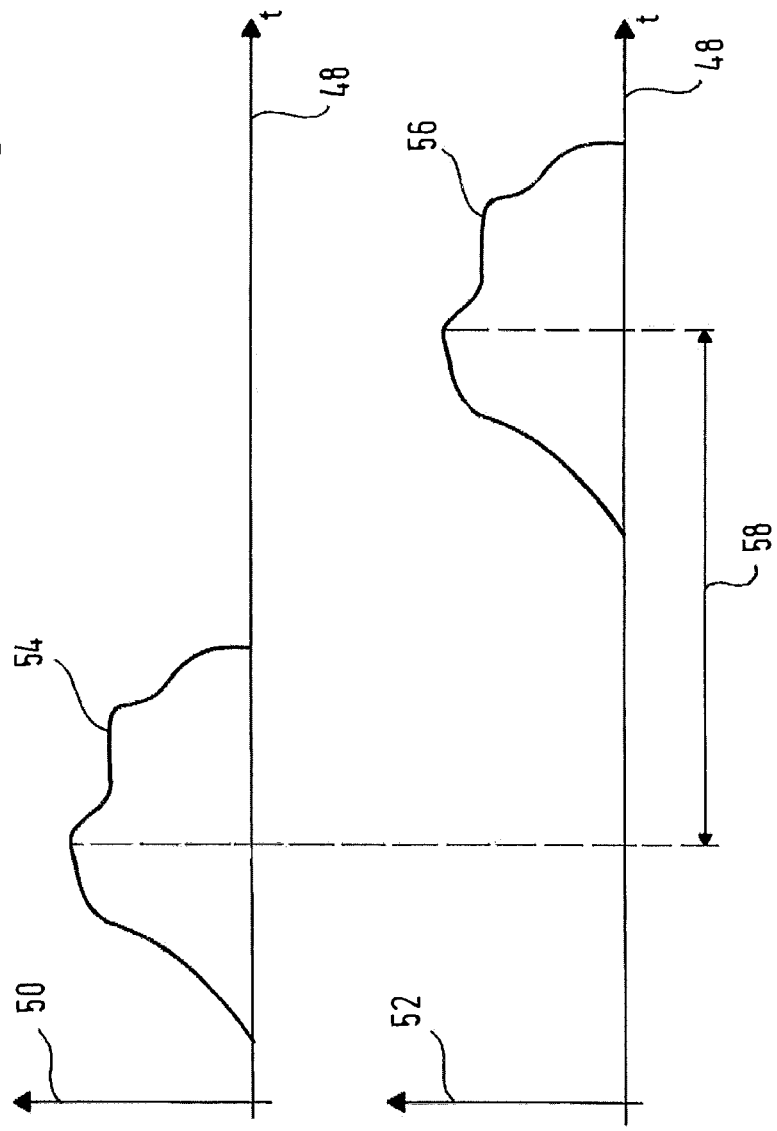

METHOD FOR LOCATING DEFECTIVE POINTS IN A HIGH FREQUENCY (HF) SIGNAL TRANSMISSION PATH

BACKGROUND OF THE INVENTION

1. Field of the Invention

The present invention relates to a method for locating points in a signal transmission path for a high frequency signal, said points being defective in terms of high frequency transmission characteristics of the signal transmission path.

2. Description of Related Art

In a signal transmission path for high frequency (HF) signals, for example in a mobile phone base station, where the signal transmission path comprises, for example, HF signal cables, HF plug connectors, a lightning protection system and/or an antenna for broadcasting the HF signal, measurements of the HF transmission characteristics often reveal diminished transmission performance which deteriorates increasingly towards the high frequencies, as is mathematically likely to be the case, or as is to be expected due to the HF transmission characteristics of the individual components. This necessitates a time-consuming fault-location search of the entire system of the signal transmission path to identify defective points at which, for example, an HF plug is not fully connected or is incorrectly assembled, or there is a break in an HF signal cable, which results at this point in a non-linear transmission function for HF signals which leads to impairment of the HF signal transmission characteristics of the overall system of the signal transmission path.

SUMMARY OF THE INVENTION

The invention is based on the problem of designing a method of the aforementioned kind such that points in a signal transmission path which are defective in terms of HF transmission characteristics can be located by simple means and at the same time with very high precision in terms of location, thus simplifying troubleshooting.

According to the invention this problem is solved through a method of the aforementioned kind with the method steps set forth in the claims. Advantageous embodiments of the invention are in described the specification herein as well as the claims.

The above and other objects, which will be apparent to those skilled in the art, are achieved in the present invention which is directed to a method for locating points in a signal transmission path for a high frequency signal, the points being defective in terms of high frequency transmission characteristics of the signal transmission path, comprising the following steps: a) generating a first HF signal with a constant predetermined frequency $f_1$ and a signal modulated by a predetermined type of modulation, wherein the type of modulation is an amplitude modulation or a digital modulation, and wherein the superimposed modulated signal is a noise; b) generating a second HF signal with a constant predetermined frequency $f_2$; c) generating a predetermined intermodulation product in the form of an intermodulation product signal with the frequency $f_{IM\text{-}GENERATED}$ from the first and the second HF signal; d) introducing the first HF signal and of the second HF signal into the signal transmission path at a predetermined introduction point; e) receiving, at the predetermined introduction point, of an intermodulation product which is generated in the signal transmission path from the first HF signal and the second HF signal at a defective point and reflected back to the introduction point and which corresponds to the intermodulation product generated in step (c), in the form of an intermodulation product signal having the frequency $f_{IM\text{-}RECEIVED}$, f) determining a time lag $t_x$ between the generated intermodulation product signal $f_{IM\text{-}GENERATED}$ and the received intermodulation product signal $f_{IM\text{-}RECEIVED}$ by a cross-correlation; and g) calculating a length L between the introduction point and the point in the signal transmission path from which the signal received in step (e) has been reflected, from the time lag tx determined in step (f).

In step (b), the second HF signal may be generated with a signal modulated with a predetermined type of modulation, and the modulated signal and the type of modulation are identical to step (a).

In step (g), the length L is calculated according to the formula: $L = \frac{1}{2} * t_x * c$, where c is a speed of propagation of HF signals in the signal transmission path.

In step (f), the phase positions of the received intermodulation signal and the generated intermodulation signal are shifted relative to one another until the modulated signals are congruent, whereby the time difference $t_x$ is determined from the phase shift necessary in order to achieve congruence.

In step (c), the third-order intermodulation product IM3 is generated with the frequency $f_{IM3\text{-}GENERATED} = 2*f_1 - f_2$ or $f_{IM3\text{-}GENERATED} = 2*f_2 - f_1$ and the corresponding third-order intermodulation product IM3 $f_{IM3\text{-}RECEIVED} = 2*f_1 - f_2$ or $f_{IM3\text{-}RECEIVED} = 2*f_2 - f_1$ is received in step (e).

A point which is defective in terms of high frequency transmission characteristics of the signal transmission path comprises at least one point at which a change, in particular a sudden increase, in the HF characteristic impedance is present, at which an electrical contact is defective is, in particular at which a contact resistance is present which is greater than a predetermined value, and/or at which a non-linear transmission function for an HF signal is present.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1 shows an exemplary embodiment of the method according to the invention illustrated in the form of a schematic flow diagram; and FIG. 2 shows a graphic representation of a signal evaluation as used in the invented method.

DESCRIPTION OF THE PREFERRED EMBODIMENT(S)

In describing the preferred embodiment of the present invention, reference will be made herein to FIGS. 1 2 of the drawings in which like numerals refer to like features of the invention.

According to the invention, a method of the aforementioned kind comprises the following method steps:

(a) Generation of a first HF signal with a constant predetermined frequency $f_1$ and a signal modulated by means of a predetermined type of modulation;

(b) Generation of a second HF signal with a constant predetermined frequency $f_2$;

(c) Generation of a predetermined intermodulation product in the form of an intermodulation product signal with the frequency $f_{IM\text{-}GENERATED}$ from the first and the second HF signal;

(d) Introduction of the first HF signal and of the second HF signal into the signal transmission path at a predetermined introduction point;

(e) Reception, at the predetermined introduction point, of an intermodulation product which is generated in the signal transmission path from the HF signals 1 and 2 at a defective point and reflected back to the introduction point and which corresponds to the intermodulation product generated in step (c), in the form of an intermodulation product signal having the frequency $f_{IM\text{-}RECEIVED}$;

(f) Determination of a time lag $t_x$ between the generated intermodulation product signal $f_{IM\text{-}GENERATED}$ and the received intermodulation product signal $f_{IM\text{-}RECEIVED}$ by means of a cross-correlation; and (g) Calculation of a length L between the introduction point and the point in the signal transmission path from which the signal received in step (e) has been reflected, from the time lag $t_x$ determined in step (f).

This has the advantage that, by using intermodulation products generated at defective points of the signal transmission path, such points can be localized very precisely without needing to intervene mechanically in the signal transmission path, in particular without needing to dismantle or destroy it, for this purpose. This simplifies and shortens the fault tracing process considerably, since it can be determined within a short time which component of the signal transmission path contains a fault and where within this component the fault is located. The location of the defective point is thereby determined in a simple manner without using complex apparatus and without complex mathematical operations.

A particularly functionally reliable cross-correlation in step (f) is achieved in that in step (b) the second HF signal (18) is generated with a signal modulated with a predetermined type of modulation, whereby, optionally, the modulated signal and the type of modulation are identical to step (a).

The method is carried out, in a particularly simple (in terms of apparatus) and functionally reliable manner in that the type of modulation used is an amplitude modulation (AM), a frequency modulation (FM), a digital modulation or a phase modulation (PM).

A mathematically particularly simple determination of the length L is achieved in that, in step (g), the length L is calculated according to the formula $L=\frac{1}{2}*t_x*c$, where c is the speed of propagation of HF signals in the signal transmission path.

A particularly simple, rapid and functionally reliable method is achieved in that in step (f) the phase positions of the received intermodulation signal and the generated intermodulation signal are shifted relative to one another until the modulated signals are congruent, whereby the time difference $t_x$ is determined from the phase shift necessary in order to achieve congruence.

A particularly precise localization using a simple technical set-up is achieved in that in step (c) the third-order intermodulation product IM3 is generated with the frequency $f_{IM3\text{-}GENERATED}=2*f_1-f_2$ or $f_{IM3\text{-}GENERATED}=2*f_2-f_1$ and the corresponding third-order intermodulation product IM3 $f_{IM3\text{-}RECEIVED}=2*f_1-f_2$ or $f_{IM3\text{-}RECEIVED}=2*f_2-f_1$ is received in step (e).

A point which is defective in terms of high frequency transmission characteristics of the signal transmission path comprises at least one point at which a change, in particular a sudden increase, in the HF characteristic impedance is present, at which an electrical contact is defective is, in particular at which a contact resistance is present which is greater than a predetermined value, and/or at which a non-linear transmission function for an HF signal is present.

In a particularly preferred embodiment, the superimposed modulated signal is a noise, in particular a pseudo noise.

The preferred embodiment of the method according to the invention represented by way of example in FIG. 1 relates to the analysis of a signal transmission path (not shown), which is connected electrically at an introduction point 10, with regard to fault locations which affect the HF transmission characteristics. These fault locations cause a non-linear transmission function in terms of the transmission of HF signals. The present method exploits the fact that such non-linear transmission functions lead to the generation of intermodulation products when two HF signals of differing frequency simultaneously meet at such a point with non-linear transmission function. These intermodulation products are generated at these points and represent, not a reflection of a fed signal, but a new HF signal not previously present in the signal transmission path, which is herein referred to as an intermodulation signal or also intermodulation product.

In a first block 12 "$f_1$ mod.", a first HF signal 14 with a predetermined, constant frequency $f_1$ is generated. A signal, in particular a LF signal or a noise, is modulated onto this first HF signal 14. An amplitude modulation is, for example, used here as modulation method, but it is also possible to use any other known form of modulation, for example frequency modulation (FM), digital modulation or phase modulation (PM).

In a second block 16 "$f_2$ mod.", a second HF signal 18 with a predetermined, constant frequency $f_2$ is generated. Again, a signal, in particular an LF signal or noise, is modulated onto this second HF signal 18 with a predetermined type of modulation, whereby the modulated signal and the type of modulation chosen are identical to the modulated signal and the type of modulation in the first HF signal 14. The phase position of the modulated signal is also identical for the first HF signal 12 and the second HF signal 18. The modulated signal in each case has a lower frequency than the HF signals $f_1$ and $f_2$. The modulated signal is for example a low-frequency LF signal with frequency components within the range from 20 Hz to 20 kHz. The modulated signal has, for example, a periodically recurring signal waveform.

In a third block "PA1" 20, the first HF signal 12 is amplified and in a fourth block "PA2" 22, the second HF signal 18 is amplified. Following amplification in the blocks 20 and 22, the two HF signals 12, 18 are passed to a combiner 24. The combiner 24 passes the HF signals 12, 18, combined in one cable, to a fifth block 26 which contains a duplex filter and feeds the first and second HF signals 12, 18 into the signal transmission path at the introduction point 10 via a coupler 28. On their way through the signal transmission path these two HF signals 12, 18 may encounter a point with non-linear transmission function, for example a defective HF plug connector, a bad solder point or a cable break, so that, as such, undesired intermodulation products, for example the third-order intermodulation product IM3, are generated from the two HF signals 12, 18. These intermodulation products return to the introduction point 10 as signals or intermodulation products or intermodulation product signals generated in the signal transmission path.

By means of the fifth block 26, a signal generated in the signal transmission path is at the same time received at the introduction point 10 and the third-order intermodulation product IM3 30 with a frequency $f_{IM\text{-}RECEIVED}$ is filtered out by means of the duplex filter and output via an output 32. This received IM3 30 is passed via an amplifier ("LNA—low noise amplifier") 34 and an A/D converter 36 to a sixth block 38.

In the coupler 28 the input first and second HF signals 12, 18 are coupled out and in a seventh block 40 "IM3 Ref" the third-order intermodulation product IM3 42 with the frequency $f_{IM\text{-}GENERATED}(t)$ is generated from these two HF signals 12, 18. This generated IM3 42 is also passed via an amplifier ("LNA—Low noise amplifier") 44 and an A/D converter 46 to the sixth block 38.

The frequency $f_{IM\text{-}GENERATED}$ of the third-order generated intermodulation product IM3 42 is thus derived from the frequency f1 of the first HF signal 12 and from the frequency f2 of the second HF signal 18 according to the equation $$f_{IM3\text{-}GENERATED} = f_1 - f_2.$$

The same applies to the received intermodulation product IM3 30. Both intermodulation products 30, 34 also include the superimposed modulated signal. However, due to runtime differences the received IM3 30 and the generated IM3 42 are present at the introduction point 10 at different times, since the received intermodulation product IM3 30 has in addition covered a distance L from the introduction point 10 to the point with non-linear transmission function and the distance L from the point with non-linear transmission function back to the introduction point 10.

In the block 38, which is for example designed as an FPGA ("Field Programmable Gate Array"), the received and generated intermodulation products 30 and 42 are compared with one another. This is done by means of a cross-correlation. A value for a cross-correlation function for the received IM3 30 and the generated IM3 42 for different runtime differences t is determined. This cross-correlation function has a maximum for a runtime difference tx. This runtime difference $t_x$ corresponds to the runtime difference for these two IM3 30, 42. This is shown in FIG. 2. This represents the development over time of the modulated generated IM3 42 and the received IM3 30. The time t is entered on an x-axis 48, an amplitude of the generated IM3 42 is entered on a first y-axis 50 and an amplitude of the received IM3 30 is entered on a second y-axis 52.

A first graph 54 illustrates the development over time of the amplitude of the generated IM3 42 and a second graph 56 illustrates the development over time of the amplitude 52 of the received IM3 30. The two amplitude curves are identical since both IM3 30, 42 have the identical in-phase modulated signal. There is simply a time lag $t_x$ 58 between the two IM3 signals 30, 42.

This can now be exploited for an evaluation by means of a cross-correlation using these two signals. For different time shifts t as parameter for the cross-correlation function, a maximum of the cross-correlation function results for the parameter $t = t_x$. In other words, by means of the cross-correlation, the amplitude curves 54, 56 of the two IM3 signals 30, 42 are shifted in relation to one another, i.e., along the time axis 48, until the two amplitude curves 54, 56 are congruent. The necessary shift t corresponds exactly to the runtime difference $t_x$ between the two IM3 signals 30, 42.

The length L between the introduction point 10 and the defective point to be located in the signal transmission path can be determined in a simple manner from this runtime difference $t_x$ according to $$L = \tfrac{1}{2} * t_x * c,$$

where c is the speed of propagation of HF signals in the signal transmission path.

This distance L is the distance from the introduction point 10 to a point at which the third-order intermodulation product IM3 30 was generated in the signal transmission path from the first and second HF signal 12, 18.

This distance or length L now only needs to be measured along the signal transmission path 10 and one arrives at precisely the location within the signal transmission path 10 at which a fault with non-linear transmission function is located which affects the HF transmission characteristics of the signal transmission path 10. This can be a break in an HF cable or a fault in the antenna or a defective HF plug connector or a defective solder joint. If necessary, the electrical length L can be converted into a mechanical length. Naturally, several defective points can be present in the signal transmission path at the same time; in this case several time-shifted received intermodulation products IM3 30 are obtained which can all be analyzed simultaneously so that several runtime differences $t_x$ and several lengths L can be determined. The fact that a newly generated intermodulation product is used as the considered received signal ensures that the length L only relates to a defective point with non-linear transmission function and not to any other reflection of an HF signal with different causes or different sources.

The block 38 is connected with a computer 60 for the purpose of control and data output.

The third-order intermodulation product IM3 is used in the preferred embodiment of the method according to the invention represented in FIGS. 1 and 2. However, this is used purely by way of example, and other intermodulation products can also be used, for example the second order ($2*f_1$, $2*f_2$, $f_1+f_2$, $f_2-f_1$), or fourth order or higher intermodulation product. The only important thing is that the generated intermodulation product $f_{IM\text{-}GENERATED}(t)$ and the received intermodulation product $f_{IM\text{-}RECEIVED}(t)$ are identical and that both are, in particular, modulated in-phase.

Practically, a device for carrying out the method according to the invention is calibrated before the first measurement in order to eliminate runtimes of the compared HF signals 30 and 42 in the electronic evaluation system before the introduction point 10 outside of the signal transmission path.

Optionally, frequency converters (down-converters) 62 are provided for the generated and the received IM3s which convert the respective frequencies of these signals to a frequency suitable for the LNAs 34, 44 and the A/D converters 36, 46.

Optionally, the modulated signal can also be dispensed with for the second HF signal 18. The modulated signal is already included in the evaluated intermodulation products 30 and 34 through the first HF signal 12.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for locating points in a signal transmission path for a high frequency (HF) signal, said points being defective in terms of high frequency transmission characteristics of the signal transmission path, comprising the following steps:
  (a) generating a first HF signal with a constant predetermined frequency, $f_1$, and a signal modulated by a predetermined type of modulation, wherein the predetermined type of modulation is an amplitude modulation or a digital modulation, and wherein said modulated signal is a noise;
  (b) generating a second HF signal with a constant predetermined frequency, $f_2$;
  (c) generating a predetermined intermodulation product in the form of an intermodulation product signal with a frequency, $f_{IM\text{-}GENERATED}$ from the first and second HF signal;

(d) introducing the first HF signal and the second HF signal into the signal transmission path at a predetermined introduction point;

(e) receiving, at the predetermined introduction point, an intermodulation product signal, which is generated in the signal transmission path from the first HF signal and the second HF signal at a defective point and reflected back to the predetermined introduction point and which corresponds to the intermodulation product generated in step (c), having a frequency, $f_{IM\text{-}RECEIVED}$;

(f) determining a time lag, $t_x$, between the generated predetermined intermodulation product signal with the frequency, $f_{IM\text{-}GENERATED}$, and the received intermodulation product signal with the frequency, $f_{IM\text{-}RECEIVED}$, by a cross-correlation; and (g) calculating a length, L, between the predetermined introduction point and the point in the signal transmission path from which the signal received in step (e) has been reflected, from the time lag, $t_x$, determined in step (f), L is an integer or decimal and $t_x$ is an integer.

2. The method of claim 1, wherein said step (b) the second HF signal is generated with a signal modulated with a second predetermined type of modulation.

3. The method of claim 2, wherein the modulated signal and the second predetermined type of modulation are identical to said step (a).

4. The method of claim 1, wherein said step (g) the length, L, is calculated according to a formula:

$$L = \tfrac{1}{2} * t_x * c,$$

where c is a speed of propagation of the first HF signal and the second HF signal in the signal transmission path and c is an integer.

5. The method of claim 1, wherein said step (f), phase positions of the received intermodulation signal and the generated intermodulation signal are shifted relative to one another until the generated intermodulation product signal at the frequency $_{fIM\text{-}GENERATED}$ and the received intermodulation product signal at the frequency $_{fIM\text{-}RECEIVED}$ signals are congruent and for a phase shift, whereby the time lag, $t_x$ is determined from the phase shift necessary in order to achieve congruence.

6. The method of claim 1, wherein said step (c), a third-order intermodulation product, $IM_3$, is generated with frequency, $f_{IM_3\text{-}GENERATED} = 2 * f_1 - f_2$ or $f_{IM_3\text{-}GENERATED} = 2 * f_2 - f_1$ and a corresponding third-order intermodulation product with frequency, $f_{IM_3\text{-}RECEIVED} = 2 * f_1 - f_2$ or $f_{IM_3\text{-}RECEIVED} = 2 * f_2 - f_1$ is received in step (e).

7. The method of claim 1, wherein a point is defective in the HF transmission characteristics of the signal transmission path comprises at least one point at which a change, a sudden increase, in the HF characteristic impedance is present, at which an electrical contact is defective, when a contact resistance is present that is greater than a predetermined value, and/or at which a non-linear transmission function for an HF signal is present.

8. The method of claim 3, wherein said step (g) the length, L, is calculated according to the formula:

$$L = \tfrac{1}{2} * t_x * c,$$

where c is a speed of propagation of the first HF signals and the second HF signal in the signal transmission path and c is an integer.

9. The method of claim 8, wherein said step (f), the phase positions of the received intermodulation signal and the generated intermodulation signal are shifted relative to one another until the received intermodulation signal and the generated intermodulation product signal are congruent and form a phase shift, whereby the time lag, $t_x$, determined from the phase shift necessary in order to achieve congruence.

10. The method of claim 9, wherein said step (c), the third-order intermodulation product, $IM_3$, is generated with the frequency, $f_{IM_3\text{-}GENERATED} = 2*f_1 - f_2$ or $f_{IM_3\text{-}GENERATED} = 2*f_2 - f_1$ and the corresponding third-order intermodulation product with frequency, $f_{IM_3\text{-}RECEIVED} = 2*f_1 - f_2$ or $f_{IM_3\text{-}RECEIVED} = 2*f_2 - f_1$ is received in step (e).

* * * * *